US010259956B2

(12) United States Patent
Chopra et al.

(10) Patent No.: US 10,259,956 B2
(45) Date of Patent: Apr. 16, 2019

(54) CURABLE INK COMPOSITION

(71) Applicant: Xerox Corporation, Norwalk, CT (US)

(72) Inventors: Naveen Chopra, Oakville (CA); Gordon Sisler, St. Catharines (CA); Saleh Jiddawi, Vancouver (CA); C. Geoffrey Allen, Waterdown (CA); Carolyn Moorlag, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 203 days.

(21) Appl. No.: 15/290,396

(22) Filed: Oct. 11, 2016

(65) Prior Publication Data
US 2018/0100075 A1 Apr. 12, 2018

(51) Int. Cl.
| | |
|---|---|
| *C09D 11/10* | (2014.01) |
| *C09D 11/101* | (2014.01) |
| *C09D 11/104* | (2014.01) |
| *C09D 135/00* | (2006.01) |
| *C09D 135/02* | (2006.01) |
| *B29C 67/00* | (2017.01) |
| *C09D 11/00* | (2014.01) |
| *G03F 7/00* | (2006.01) |

(Continued)

(52) U.S. Cl.
CPC ............ *C09D 11/101* (2013.01); *B29C 64/00* (2017.08); *B29C 64/124* (2017.08); *B29C 67/00* (2013.01); *C09D 11/00* (2013.01); *C09D 11/104* (2013.01); *C09D 135/00* (2013.01); *C09D 135/02* (2013.01); *G03F 7/0037* (2013.01); *B29K 2033/08* (2013.01); *B33Y 10/00* (2014.12); *B33Y 70/00* (2014.12); *B33Y 80/00* (2014.12)

(58) Field of Classification Search
CPC ....... C09D 11/00; C09D 11/101; C09D 11/30; C09D 11/104; C09D 135/00; C09D 135/02; B29C 64/00; B29C 64/124; B29C 67/00; G03F 7/0037
USPC ......................................................... 522/96
See application file for complete search history.

(56) References Cited

U.S. PATENT DOCUMENTS

| | | | |
|---|---|---|---|
| 5,362,427 | A | 11/1994 | Mitchell, Jr. |
| 5,503,785 | A | 4/1996 | Crump et al. |

(Continued)

FOREIGN PATENT DOCUMENTS

| | | |
|---|---|---|
| EP | 1458825 A1 | 9/2004 |
| WO | WO03029366 | 4/2003 |

(Continued)

OTHER PUBLICATIONS

Extended European Search Report dated EP17192363.4, Feb. 9, 2018.

(Continued)

*Primary Examiner* — Sanza L. McClendon

(57) ABSTRACT

A curable ink composition for forming a three-dimensional (3D) object via a digital additive manufacturing system is provided. The composition may comprise greater than about 30 weight % of one or more oligomers, at least two monomers comprising a lowest viscosity monomer and a highest viscosity monomer, one or more photoinitiators, and optionally, one or more additives. The ratio of the weight % of the total amount of oligomers to the weight % of the total amount of monomers may be at least about 0.5 and the ratio of the weight % of the lowest viscosity monomer to the weight % of the highest viscosity monomer may be at least about 5.

19 Claims, 4 Drawing Sheets

(51) Int. Cl.
*B29C 64/00* (2017.01)
*B29C 64/124* (2017.01)
*B33Y 10/00* (2015.01)
*B33Y 70/00* (2015.01)
*B33Y 80/00* (2015.01)
*B29K 33/00* (2006.01)

(56) References Cited

U.S. PATENT DOCUMENTS

| | | | |
|---|---|---|---|
| 6,193,923 B1 | 2/2001 | Leyden et al. |
| 6,572,807 B1 | 6/2003 | Fong |
| 6,586,494 B2 | 7/2003 | Mejiritski et al. |
| 6,752,948 B2 | 6/2004 | Newell et al. |
| 6,790,403 B1 | 9/2004 | Priedeman, Jr. et al. |
| 6,841,589 B2 * | 1/2005 | Schmidt | C09D 11/101 523/160 |
| 6,863,859 B2 | 3/2005 | Levy |
| 6,869,559 B2 | 3/2005 | Hopkins |
| 6,916,441 B2 | 7/2005 | Newell et al. |
| 7,008,206 B2 | 3/2006 | Fong et al. |
| 7,074,029 B2 | 7/2006 | Stockwell et al. |
| 7,114,943 B1 | 10/2006 | Fong et al. |
| 7,176,253 B2 | 2/2007 | Xu et al. |
| 7,183,335 B2 | 2/2007 | Napadensky |
| 7,285,237 B2 | 10/2007 | Newell et al. |
| 7,300,619 B2 | 11/2007 | Napadensky et al. |
| 7,364,686 B2 | 4/2008 | Kritchman et al. |
| 7,368,484 B2 | 5/2008 | Levy |
| 7,373,214 B2 | 5/2008 | Silverbrook |
| 7,399,796 B2 | 7/2008 | Xu et al. |
| 7,479,510 B2 | 1/2009 | Napadensky et al. |
| 7,604,768 B2 | 10/2009 | Kritchman |
| 7,919,152 B2 | 4/2011 | Kritchman et al. |
| 8,246,888 B2 | 8/2012 | Hopkins et al. |
| 8,285,411 B2 | 10/2012 | Hull et al. |
| 8,318,076 B2 | 11/2012 | Wang et al. |
| 8,459,280 B2 | 6/2013 | Swanson et al. |
| 8,460,451 B2 | 6/2013 | Xu et al. |
| 8,521,320 B2 | 8/2013 | Silverbrook |
| 8,575,258 B2 | 11/2013 | Stockwell et al. |
| 8,636,850 B2 | 1/2014 | Narovlyansky et al. |
| 8,642,692 B1 | 2/2014 | Stockwell et al. |
| 8,765,045 B2 | 7/2014 | Zinniel |
| 8,865,047 B2 | 10/2014 | Sella |
| 8,903,533 B2 | 12/2014 | Eggers et al. |
| 8,932,511 B2 | 1/2015 | Napadensky |
| 9,574,039 B1 * | 2/2017 | Liu | C09J 4/06 |
| 9,701,775 B2 * | 7/2017 | Liu | C09J 4/06 |
| 9,777,097 B2 * | 10/2017 | Liu | C09J 4/06 |
| 2014/0017460 A1 | 1/2014 | Xu |
| 2014/0332997 A1 | 11/2014 | Shih et al. |

FOREIGN PATENT DOCUMENTS

| | | |
|---|---|---|
| WO | WO2004000961 | 12/2003 |
| WO | WO2014197086 | 12/2014 |

OTHER PUBLICATIONS

Bomar Oligomer Selector Guide, Dymax, Mar. 17, 2015.
K. Rhodes, Aerobic Adhesives VII—A New High Performance Bonding Option for Optical Assembly, Proc. SPIE 3936, Integrated Optics Devices IV, (Mar. 24, 2000); doi: 10.1117/12.379964.

* cited by examiner

CURABLE INK COMPOSITION

TECHNICAL FIELD

The present disclosure is directed to curable ink compositions for use, e.g., in digital additive manufacturing techniques such as multi jet modeling (MJM).

BACKGROUND

Multi jet modeling (MJM) is a digital additive manufacturing technique for forming a three-dimensional (3D) object in which successive layers of a curable ink (e.g., via ultraviolet radiation) are jetted in a shape consistent with computer-accessible image data associated with the 3D object. A sacrificial support material is typically co-jetted with the curable ink to stabilize and support the 3D object during formation. In a post-processing step, the sacrificial support material is removed, e.g., by heating the composite structure in a convection oven or by washing with hot water. Unfortunately, 3D objects often undergo dimensional changes such as warping, rounded edges, etc., during such post-processing steps.

SUMMARY

The present disclosure, which enables the post-processing of three-dimensional (3D) objects with improved fidelity to the intended structure, accordingly provides illustrative examples of curable ink compositions which may be used to form such 3D objects using digital additive manufacturing techniques.

In one aspect, curable ink compositions for forming a 3D object via a digital additive manufacturing system are provided. In embodiments, the composition comprises greater than about 30 weight % of one or more oligomers, at least two monomers comprising a lowest viscosity monomer and a highest viscosity monomer, one or more photoinitiators, and optionally, one or more additives. The ratio of the weight % of the total amount of oligomers to the weight % of the total amount of monomers is at least about 0.5 and the ratio of the weight % of the lowest viscosity monomer to the weight % of the highest viscosity monomer is at least about 5.

In other embodiments, the composition comprises greater than about 30 weight % of one or more urethane (meth) acrylate oligomers, a lowest viscosity monomer, a highest viscosity monomer, and optionally, one or more additional monomers, the monomers selected from monofunctional (meth)acrylates, multifunctional (meth)acrylates, monofunctional urethane (meth)acrylates and combinations thereof, one or more photoinitiators, and optionally, one or more additives. The ratio of the weight % of the total amount of oligomers to the weight % of the total amount of monomers is at least about 0.5 and the ratio of the weight % of the lowest viscosity monomer to the weight % of the highest viscosity monomer is at least about 5.

In another aspect, 3D objects formed from the curable ink compositions are provided.

In another aspect, methods of forming a build structure comprising a 3D object and a support matrix are provided. In embodiments, the method comprises selectively dispensing a curable ink composition towards a substrate via a digital additive manufacturing system, the curable ink composition comprising greater than about 30 weight % of one or more oligomers, at least two monomers comprising a lowest viscosity monomer and a highest viscosity monomer, one or more photoinitiators, and optionally, one or more additives. The ratio of the weight % of the total amount of oligomers to the weight % of the total amount of monomers is at least about 0.5 and the ratio of the weight % of the lowest viscosity monomer to the weight % of the highest viscosity monomer is at least about 5. The method further comprises selectively dispensing a support material towards the substrate via the digital additive manufacturing system to form a support matrix for the 3D object, the 3D object and the support matrix providing a build structure corresponding to image data accessible by a processor of the digital additive manufacturing system and curing the as-deposited curable ink composition.

These and other aspects will be discussed in greater detail below.

BRIEF DESCRIPTION OF THE DRAWINGS

Illustrative embodiments will hereafter be described with reference to the accompanying drawings.

DETAILED DESCRIPTION

Figure 1:
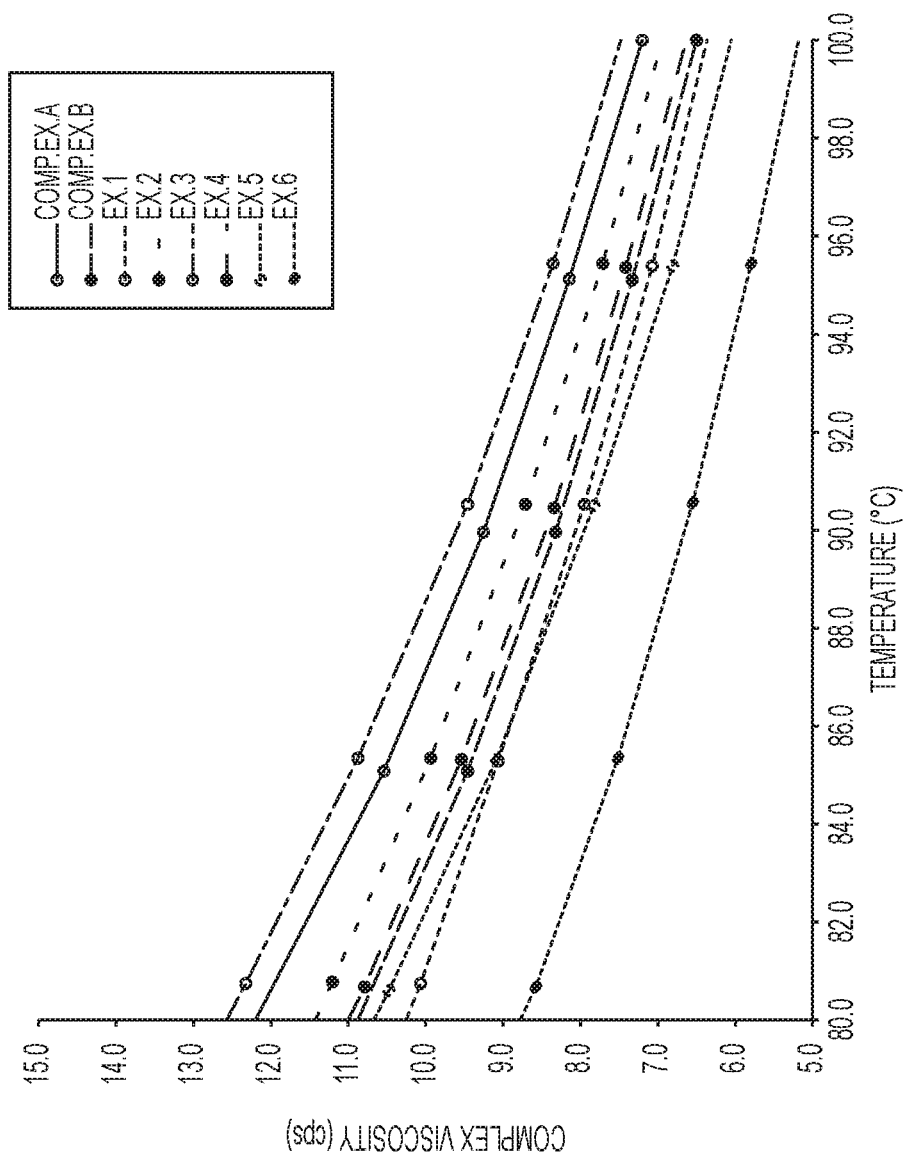
FIG. 1 shows viscosity data versus temperature for illustrative curable ink compositions and two comparative curable ink compositions.

In one aspect, the present disclosure provides a curable ink composition. As further described below, in embodiments, the curable ink composition contains various oligomers, monomers, photoinitiators and optionally, additives. Upon exposure to radiation and further induced by the photoinitiators, chemically reactive functionalities on the oligomers and monomers undergo free radical polymerization reactions to form a cured polymer matrix. The particular selection of components and relative amounts depends upon the desired properties for the curable ink composition as well as the desired properties for three-dimensional (3D) objects formed using the curable ink composition. However, as further described below, by contrast to conventional curable ink compositions used in digital additive manufacturing, the present curable ink compositions are characterized by relatively high amounts of oligomers. (See, e.g., U.S. Pat. Nos. 8,916,084 and 8,771,787.) Conventionally, the oligomeric content has been minimized to ensure a sufficiently low viscosity so that the curable ink composition can be dispensed (e.g., jetted) using digital additive manufacturing systems and to avoid embrittlement of the resulting 3D object.

For example, in embodiments, the oligomer content of the present curable ink compositions is greater than 30 weight % (e.g., at least about 50 weight %) based on the total weight of the curable ink composition. In embodiments, such curable ink compositions exhibit jettable viscosities as well as improved mechanical properties when cured (e.g., increased storage modulus, increased loss modulus, increased peak tan δ temperature, decreased peak tan δ value). Thus, such curable ink compositions can be used to form 3D objects via digital additive manufacturing systems which can be subjected to post-processing steps at elevated temperatures to remove support materials without sacrificing the fidelity of the 3D object. The improved mechanical properties also expand engineering capabilities during manufacturing (e.g., combining digital additive manufacturing with higher temperature deposition techniques such as the deposition of metallic inks) as well as during use of the 3D objects.

Oligomers

The curable ink composition contains oligomers. A single species of oligomer may be used or combinations of different species of oligomers. Suitable, illustrative oligomers include polyester (meth)acrylates, polyether (meth)acrylates, epoxy (meth)acrylates, and urethane (meth)acrylates. Regarding urethane (meth)acrylates, known methods may be used to prepare the compounds, such as by reacting a hydroxyl-terminated urethane compound with (meth)acrylic acid or by reacting an isocyanate-terminated compound with hydroxyalkyl (meth)acrylates. The oligomers may be characterized by their functionality, depending upon the degree of branching within the molecule. In embodiments, the oligomers utilized in the curable ink composition include difunctional, trifunctional, tetrafunctional, pentafunctional, hexafunctional compounds, or combinations thereof.

The oligomers utilized in the curable ink composition may be each characterized by a dynamic viscosity, as measured using a commercially available rheometer such as the Ares G2 from TA instruments. In embodiments, the oligomer has a viscosity in the range of from about 10,000 cP to about 200,000 cP at about 50° C. This includes embodiments in which the viscosity is in the range of from about 15,000 cP to about 35,000 cP at about 50° C. or from about 100,000 cP to about 200,000 cP at about 50° C. In embodiments, the oligomer has a viscosity in the range of from about 1,000 cP to about 20,000 cP at about 25° C. This includes embodiments in which the viscosity is in the range of from about 1,000 cP to about 15,000 cP at about 25° C. or from about 5,000 cP to about 10,000 cP at about 25° C. If more than one type of oligomer is present in the curable ink compositions, these viscosity values may refer to the viscosity values for each individual oligomer present in the curable ink composition.

The oligomers utilized in the curable ink composition may be each characterized by a glass transition temperature, $T_g$, as measured using modulated differential scanning calorimetry on a commercially available differential scanning calorimeter (e.g., Discovery DSC 2500 from TA Instruments). In embodiments, the $T_g$ is less than about 300° C., in embodiments less than about 200° C. or less than about 100° C. This includes embodiments in which the $T_g$ is in the range of from about 50° C. to about 300° C., from about 60° C. to about 200° C., or from about 60° C. to about 100° C. If more than one type of oligomer is present in the curable ink compositions, these $T_g$ values may refer the $T_g$ values for each individual oligomer present in the curable ink composition.

Suitable, illustrative polyester (meth)acrylate oligomers include those commercially available from Sartomer Chemical Co. under the product names CN293, CN299, CN292, CN296, CN2279, CN2262, CN2267, CN2200, CN2203, and CN2281. Other examples include the difunctional polyester methacrylate oligomer commercially available from Dymax Corporation under the product name Bomar™ XR-741MS.

Suitable, illustrative polyether (meth)acrylates include those commercially available from Rahn Corp. under the product names Genomer 3364, Genomer 3414, Genomer 3457, and Genomer 3497.

Suitable, illustrative epoxy (meth)acrylates include those commercially available from Sartomer Chemical Co. under the product names CN104Z, CN2102E, CN110, CN120Z, CN116, CN117, CN118, CN119, and CN2003B or commercially available from Rahn Corp. under the product names Genomer 2235, Genomer 2252, Genomer 2253, Genomer 2255, Genomer 2259, Genomer 2263, Genomer 2280, and Genomer 2281.

Suitable, illustrative urethane (meth)acrylate oligomers include aromatic urethane (meth)acrylates such as those commercially available from Sartomer Chemical Co. under the product names CN9782, CN9783, CN992, CN975 (hexafunctional), and CN972, or commercially available from Rahn Corp. under the product names Genomer 4622 and Genomer 4217. Aliphatic urethane (meth)acrylates include those commercially available from Sartomer Chemical Co. under the product names CN9004, CN9005, CN9006, CN9023, CN9028, CN9178, CN969, CN9788, CN986, CN989, CN9893, CN996, CN2920, CN3211, CN9001, CN9009, CN9010, CN9011, CN9071, CN9070, CN929, CN962, CN9025, CN9026, CN968, CN965, CN964, CN991, CN980, CN981, CN983, CN9029, CN9030, CN9031, CN9032, CN9039, CN9018, CN9024 and CN9013 or commercially available from Rahn Corp. under the product names Genomer 4188, Genomer 4215, Genomer 4230, Genomer 4267, Genomer 4269, Genomer 4312, Genomer 4316, Genomer 4425, Genomer 4590 and Genomer 4690. Other examples include difunctional urethane methacrylate oligomers commercially available from Sartomer Chemical Co. under the product names CN1963 and CN1964.

Other suitable, illustrative urethane (meth)acrylate oligomers include the Bomar™ series of oligomers commercially available from Dymax Corporation under the product names: BR-441B, BR-471, BR704P, BR-741, BR-741D, BR-742P, BR-7432GI30, BR-744BT, BR742M, BR-941, B-952, BR-116, BR-146 and BR-202.

Trifunctional urethane (meth)acrylate oligomers such as those commercially available from IGM Resins under the following product names may also be used: Photomer 6008, Photomer 6010, Photomer 6019, Photomer 6184, Photomer 6630, and Photomer 6892.

By contrast to conventional curable ink compositions, the oligomers are included in the present curable ink compositions in high amounts. In embodiments, the curable ink composition includes greater than 30 weight % of the oligomer, based on the total weight of the curable ink composition. This includes embodiments in which the curable ink composition includes at least about 40 weight %, at least about 45 weight %, at least about 50 weight %, at least about 55 weight %, at least about 60 weight %, at least about 65 weight %, or at least about 70 weight % of the oligomer, based on the total weight of the curable ink composition. The maximum amount of oligomer depends upon the selected oligomer(s), but will generally be the amount at which it is still possible to jet the curable ink composition at the selected jetting temperature (e.g., about 85° C.) or at a maximum jetting temperature. In embodiments, the maximum amount of oligomer is about 75 weight %, based on the total weight of the curable ink composition. In embodiments, the curable ink composition includes from greater than about 50 weight % to 75 weight % of the oligomer. In embodiments in which more than one species of oligomer is present in the curable ink composition, these amounts refer to the total amount of oligomer in the curable ink composition. As further described in the Examples below, despite such high amounts of oligomer, illustrative curable ink compositions can still be jetted via digital additive manufacturing systems to provide 3D objects having mechanical properties which allows them to withstand post-processing steps without exhibiting undesirable embrittlement.

Monomers

The curable ink composition further contains monomers. The monomers include chemically reactive functionalities capable of undergoing free radical polymerization reactions with other monomers and/or the oligomers. A single species of monomer may be used or combinations of different species of monomers. Suitable, illustrative monomers include mono- and multifunctional (e.g., di-, tri-, etc.) (meth)acrylates.

Suitable, illustrative monofunctional (meth)acrylates include 2-phenoxyethylacrylate, alkoxylated lauryl acrylate, alkoxylated phenol acrylate, alkoxylated tetrahydrofurfuryl acrylate, caprolactone acrylate, cyclic trimethylolpropane formyl acrylate, ethylene glycol methyl ether methacrylate, ethoxylated nonyl phenol acrylate, isobornyl acrylate (e.g., SR506 from Sartomer Chemical Corp.), isobornyl methacrylate (e.g., SR 423 from Sartomer Chemical Corp.), isodecyl acrylate, isooctyl acrylate, lauryl acrylate, octadecyl acrylate (stearyl acrylate), tetrahydrofurfuryl acrylate (e.g., SR285 from Sartomer Chemical Co.), tridecyl acrylate, and 4-acryolyl morpholine (from Aldrich Chemical Co.). Monofunctional urethane (meth)acrylates such as 2-[[(butylamino)carbonyl]oxy]ethyl acrylate, available from IGM Resins under the product name Photomer 4184 may be used.

Suitable, illustrative difunctional (meth)acrylates include 1,12 dodecane diol diacrylate, 1,3-butylene glycol diacrylate, 1,4-butanediol diacrylate, 1,6-hexanediol diacrylate (e.g., SR238B from Sartomer Chemical Co.), alkoxylated hexanediol diacrylate, alkoxylated neopentyl glycol diacrylate, cyclohexane dimethanol diacrylate, diethylene glycol diacrylate (e.g., SR230 from Sartomer Chemical Co.), ethoxylated (4) bisphenol A diacrylate (e.g., SR601 from Sartomer Chemical Co.), neopentyl glycol diacrylate, polyethylene glycol (400) diacrylate (e.g., SR344 from Sartomer Chemical Co.), propoxylated (2) neopentyl glycol diacrylate (e.g., SR9003B from Sartomer Chemical Co.), tetraethylene glycol diacrylate (e.g., SR268 from Sartomer Chemical Co.), tricyclodecane dimethanol diacrylate (e.g., SR833S from Sartomer Chemical Co.), triethylene glycol diacrylate (e.g., SR272 from Sartomer Chemical Co.), and tripropylene glycol diacrylate.

Suitable, illustrative trifunctional (meth)acrylates include ethoxylated (9) trimethylol propane triacrylate, pentaerythritol triacrylate, propoxylated (3) glyceryl triacrylate (e.g., SR9020 from Sartomer Chemical Co.), propoxylated (3) trimethylol propane triacrylate (e.g., SR492 from Sartomer Chemical Co.), and tris (2-hydroxylethyl) isocyanurate triacrylate (e.g., SR368 from Sartomer Chemical Co.).

Other suitable multifunctional (meth)acrylates include di-trimethylolpropane tetraacrylate, dipentaerythritol pentaacrylate (e.g., SR399 from Sartomer Chemical Co.), and ethoxylated (4) pentaerythritol tetraacrylate (e.g., SR494 from Sartomer Chemical Co.).

In embodiments, the monomers are selected from the group consisting of (meth)acrylates (monofunctional) and di(meth)acrylates. In embodiments, the monomers do not include any tri(meth)acrylates. In embodiments, the monomers do not include tricyclodecane dimethanol diacrylate. In embodiments, the monomers do not include an non-oligomeric urethane (meth)acrylate, a urea (meth)acrylate, an isocyanurate (meth)acrylate, or all three. In embodiments, the monomers do not include tris(2-hydroxy ethyl) isocyanurate triacrylate. In embodiments, the monomers do not include a monofunctional urethane (meth)acrylate. In embodiments, the monomers do not include 2-[[(butylamino)carbonyl]oxy] ethyl acrylate.

Monomers utilized in the curable ink composition which are liquids at room temperature may be each characterized by a dynamic viscosity, as measured using a commercially available rheometer such as the Ares G2 from TA instruments. In embodiments, the monomer has a dynamic viscosity of less than about 50 cP at about 25° C. This includes embodiments in which the monomer has a dynamic viscosity of less than about 40 cP at about 25° C. or less than about 30 cP at about 25° C. In embodiments, the monomer has a dynamic viscosity in the range of from about 5 cP to about 50 cP at about 25° C. This includes embodiments in which the viscosity is in the range of from about 5 cP to about 30 cP at about 25° C. or from about 5 cP to about 25 cP at about 5° C. If more than one type of monomer is present in the curable ink compositions, these viscosity values may refer the viscosity value of each individual monomer present in the curable ink compositions.

Monomers utilized in the curable ink composition which are solids at room temperature may be each characterized by a melting temperature. In embodiments, the monomer has a melting temperature in the range of from about 30° C. to about 100° C. This includes embodiments in which the melting temperature is in the range of from about 30° C. to about 70° C., or from about from about 40° C. to about 60° C.

The monomers may be included in the present curable ink compositions in various suitable amounts. In embodiments, the monomer is present in the curable ink composition in an amount ranging from about 1 weight % to about 40 weight %, based on the total weight of the curable ink composition. This includes embodiments in which the monomer is present in an amount ranging from about 1 weight % to about 10 weight %, from about 1 weight % to about 5 weight %, from about 10 weight % to about 20 weight %, from about 20 weight % to about 40 weight %, or from about 25 weight % to about 35 weight %, based on the total weight of the curable ink composition. In embodiments in which more than one species of monomer is present in the curable ink composition, these amounts may refer to the amount of each individual monomer present in the curable ink composition.

In embodiments, the total amount of monomer present in the curable ink composition is not more than 70 weight %, based on the total weight of the curable ink composition. This includes embodiments in which the total amount is not more than 65 weight %, not more than 60 weight %, not more than 55 weight %, not more than 50 weight %, not more than 45 weight %, or not more than 40 weight %, based on the total weight of the curable ink composition. This includes embodiments in which the total amount is in the range of from about 35 weight % to less than 60 weight %, from about 35 weight % to less than 55 weight %, from about 35 weight % to about 50 weight %, or from about 35 weight % to about 45 weight %, based on the total weight of the curable ink composition.

In embodiments, the curable ink composition includes more than one species of monomer having different viscosity values. The present curable ink compositions may be characterized by relatively high ratios of the lowest viscosity monomer to the highest viscosity monomer (as determined by the (weight % of the lowest viscosity monomer)/(weight % of the highest viscosity monomer)). In embodiments, this ratio is at least about 5. This includes embodiments in which the ratio is at least about 6, at least about 7, at least about 8, or at least about 9. In embodiments, this ratio is in the range of from about 5 to about 10. This includes embodiments in which the ratio is in the range of from about 6 to about 9, or from about 6 to about 8.

The present curable ink compositions may be characterized by relatively high ratios of oligomer to monomer (as determined by the (weight % of total oligomer)/(weight % of total monomer)). In embodiments, this ratio is at least about 0.5. This includes embodiments in which this ratio is at least about 0.7, at least about 0.9, at least about 1.0, or at least about 1.2. In embodiments, this ratio is in the range of from about 0.5 to about 1.5. This includes embodiments in which this ratio is in the range of from about 0.7 to about 1.2, from about 0.8 to about 1.2, from about 0.9 to about 1.2 or about 1.0.

Photoinitators

The curable ink composition further contains photoinitiators. A single species of photoinitiator may be used or combinations of different species of photoinitiators. Any photoinitiator that absorbs radiation, e.g., UV or visible radiation, to induce free radical polymerization reactions between the selected oligomers and/or selected monomers may be used. Suitable, illustrative photoinitiators such as benzophenones, benzoin ethers, benzil ketals, α-hydroxyalkylphenones, α-alkoxyalkylphenones, ☆-aminoalkylphenones, and acylphosphine photoinitiators may be used. The photoinitiator 2,4,6 Trimethylbenzoyldiphenylphosphine oxide (TPO) may be used. Suitable, illustrative photoinitiators include those commercially available from BASF under the product names Irgacure-184 and Irgacure TPO may be used.

The photoinitiator may be included in the curable ink composition in various suitable amounts. In embodiments, curable ink composition includes from about 0.1 weight % to about 10 weight % of the photoinitiator, based on the total weight of the curable ink composition. This includes embodiments in which the curable ink composition includes from about 0.1 weight % to about 10 weight % or from about 0.1 weight % to about 5 weight % of the photoinitiator based on the total weight of the curable ink composition. In embodiments in which more than one species of photoinitiator is present in the curable ink composition, these amounts may refer to the total amount of photoinitiator in the curable ink composition.

Additives

A variety of additives may be optionally added to the curable ink composition. Suitable, illustrative additives include sensitizing agents to increase the effectiveness of the photoinitiators, polymerization inhibitors to promote thermal stability, and antioxidant agents. When present, additives may be included in various suitable amounts. In embodiments, the curable ink composition includes from about 0.1 weight % to about 15 weight % of the additive, based on the total weight of the curable ink composition. This includes embodiments in which the curable ink composition includes from about 0.1 weight % to about 10 weight % or from about 0.1 weight % to about 5 weight % of the additive based on the total weight of the curable ink composition. In embodiments in which more than one species of additive is present in the curable ink composition, these amounts may refer to the total amount of additives in the curable ink composition.

Various curable ink compositions may be formed according to the guidance provided above, e.g., curable ink compositions having various combinations of the disclosed components at the disclosed amounts and ratios. Such curable ink compositions may have (in uncured and uncured forms) various combinations of the characteristics disclosed throughout this specification. In embodiments, the curable ink compositions consist or consist essentially of the disclosed components, i.e., the oligomer component, the monomer component, the photoinitiator component, and optionally, the additive component.

In embodiments, the curable ink compositions do not include any of the reactive components disclosed in U.S. Pat. No. 9,157,007, which is hereby incorporated by reference for such reactive components. In embodiments, the curable ink compositions do not include a wax as disclosed in, e.g., U.S. Pat. Nos. 8,853,293 and 8,758,865. In embodiments, the curable ink compositions do not include any of the non-reactive waxes disclosed in U.S. Pat. No. 7,285,237, which is hereby incorporated by reference for such non-reactive waxes.

The curable ink compositions may be formed by combining the selected components at the selected amounts under conditions sufficient to form a homogeneous liquid mixture. An illustrative method is described in the Examples, below.

The curable ink composition, in its uncured form, may be characterized by a complex viscosity as measured using a commercially available rheometer, e.g., an Ares G2 rheometer, as described in the Examples, below. In embodiments, the curable ink composition is characterized by a complex viscosity at about 85° C. in the range of from about 6 cP to about 15 cP, from about 7 cP to about 12 cP, or from about 7 cP to about 10 cP. These viscosity values may be referred to as "jettable viscosity values" in that curable ink compositions having such viscosity values are able to be jetted by various digital additive manufacturing systems at typical jetting temperatures (e.g., 85° C.).

The curable ink composition, in its cured form, may be characterized by one or more of the following characteristics:

(1) A storage modulus (E') at 25° C., in embodiments, of from about 1000 MPa to about 2500 MPa, from about 1000 MPa to about 2200 MPa, or from about 1500 to about 2000 MPa.

(2) A storage modulus (E') at 65° C., in embodiments, of from about 100 MPa to about 1000 MPa, from about 100 MPa to about 900 MPa, or from about 500 to about 900 MPa.

(3) A tan δ peak temperature, in embodiments, of at least about 70° C., at least about 80° C., at least about 90° C., or at least about 100° C.

(4) A tan δ peak value, in embodiments, of less than about 0.6, less than about 0.5, or less than about 0.4.

(5) A glass transition temperature, $T_g$, in embodiments, of at least about 70° C., at least about 80° C., at least about 90° C., or at least about 100° C. An instrument for measuring $T_g$ has been described above.

Storage modulus (E') and tan δ peak temperature and value may be determined by obtaining stress and strain data for the curable ink compositions using a Dynamic Mechanical Analysis device, such as a DMA Q800 (TA Instruments) operated as described in the Examples, below. Prior to obtaining the stress and strain data, the curable ink compositions may be cured as described in the jetting method in the Examples, below. Briefly, a known dynamic stress (force per unit area over time) via sinusoidal oscillation is applied to a sample which results in a corresponding strain in that sample of which its amplitude, k, and phase angle shift, δ, can be determined. The complex modulus, E*, is the ratio of the stress amplitude, $\sigma_A$, to the strain amplitude, $\varepsilon_A$, or $E^* = \sigma_A / \varepsilon_A$ and includes the storage modulus, E', (or the real part indicating the elastic component of the sample) and the loss modulus, E", (or the imaginary part indicating proportional energy losses such as heat or conversion to irrecoverable internal motions). For a given frequency, ω, E'(ω)=|E*|*cos (δ) and E" (ω)=|E*|*sin(δ). Peak tan δ is the temperature occurring at the highest tan δ value for the test, such as for a temperature sweep under constant stress. The storage modulus, the tan δ peak temperature and the tan δ peak value may be reported with reference to the frequency used, e.g., 1 kHz.

In another aspect, the present disclosure provides a method of forming a 3D object using any of the present curable ink compositions. In embodiments, the method includes selectively dispensing a curable ink composition towards a substrate via a digital additive manufacturing system to form the 3D object, the 3D object corresponding to image data accessible by a processor of the digital additive manufacturing system. Any number of digital additive manufacturing systems may be used, e.g., multi jet modeling systems. Such systems may include a print head and the substrate (i.e., a build plate). The print head may be operably coupled to a source of the curable ink composition, the print head configured to jet drops of the curable ink composition towards the substrate. The system may further include a controller configured to control the operation of various devices of the system (e.g., the print head). As is known in the art, the controller may include various interfaces, a computer-readable medium, the processor and a control application. The image data associated with the 3D object to be formed may be stored in such computer-readable medium to be accessed by the processor during execution of the method. Such systems form 3D objects incrementally, in a layer-by-layer fashion, by adding curable ink composition in specific locations to build up successive layers in a shape consistent with the image data.

The method may further include selectively dispensing a support material towards the substrate via the digital additive manufacturing system to form a support matrix for the 3D object, the 3D object and the support matrix providing a build structure corresponding to image data accessible by the processor. The type of support material is not limited and known support materials may be used.

The method may further include curing the as-deposited curable ink composition. The curing step may include exposing the as-deposited curable ink composition to radiation under conditions sufficient to cure the curable ink composition. These conditions may include the wavelength of the radiation, the intensity of the radiation and the exposure time. Regarding wavelength, the radiation may be ultraviolet (UV) radiation including wavelengths in the range of from about 300 nm to about 400 nm. However, visible radiation (e.g., including wavelengths in the range from about 400 nm to about 700 nm) may also be used. A suitable, illustrative curing step is described in the Examples, below. The method may include curing one or more layers of the as-deposited curable ink composition prior to dispensing an additional layer.

The method may further include a post-processing step such as removing the support matrix from the build structure to provide the 3D object. Known methods may be used to remove the support matrix, e.g., melting in a convection oven or using hot water. However, by contrast to conventional methods employing conventional curable ink compositions, in embodiments, 3D objects formed using the disclosed curable ink compositions exhibit substantially no deformation after such a post-processing step. By "substantially" it is meant that the deformation of the 3D object is sufficiently minimal that the shape and the dimensions of the post-processed 3D object are the same, within preselected tolerance values, as the 3D object prior to post-processing under visual inspection (even if the shape/dimensions are not perfectly the same).

In another aspect, the present disclosure provides a 3D object (or a build structure including the 3D object and a support matrix) formed using the present curable ink compositions. In embodiments, the 3D object is composed of a composition cured from a curable ink composition. Any of the disclosed curable ink compositions may be used.

EXAMPLES

The following Examples are being submitted to illustrate various embodiments of the present disclosure. These Examples are intended to be illustrative only and are not intended to limit the scope of the present disclosure. Also, parts and percentages are by weight unless otherwise indicated. As used throughout this specification, "room temperature" refers to a temperature of from about 20° C. to about 25° C.

Preparation of Curable Ink Compositions.

Six curable ink compositions (Examples 1-6) were prepared according to Table 1A. For each ink composition, the oligomer was added to a 30 mL amber glass bottle with a magnetic stir bar, followed by multifunctional monomers (di- and tri-functional monomers). The mixture was allowed to be stirred on a Vario-Mag® heated stirring block at 85° C. for 30 minutes. After the formation of a homogeneous liquid mixture, the monofunctional monomer and the photoinitiators were added, and mixing was continued for another 60 minutes to furnish the final ink compositions.

Larger scale ink compositions were prepared in a similar fashion, using a 1 L glass beaker fitted with a glass-fibre heating mantle connected to a temperature controller and thermocouple. Mixing was achieved using an overhead mixing apparatus fitted with a P3 impeller. The ink was filtered through a 1 mm filter media to furnish the final ink compositions.

Two comparative curable ink compositions were used as is. Objet RGD810, commercially available from Stratasys, was used as Comparative Example A and VisiJet® CR-CL, commercially available from 3D Systems, Inc., was used as Comparative Example B. Objet RGD810 includes about 30 weight % acrylic monomer, about 25 weight % isobomyl acrylate, about 15 weight % phenol, 4,4'-(1-methylethylidene)bis-, polymer with (chloromethyl)oxirane, 2-propenoate, about 2 weight % photoinitiator, and about 0.3 weight % acrylic acid ester. VisiJet® CR-CL includes 20-30 weight % triethylene glycol diacrylate, 15-25 weight % isobomyl acrylate and 0.2-1 weight % photoinitiator.

Table 1B shows the ratio of the lowest viscosity monomer (isobomyl (meth)acrylate) to the highest viscosity monomer (tetraethylene glycol diacrylate) and the ratio of total oligomer to total monomer for Examples 1-6.

TABLE 1A

Curable Ink Compositions.

| | Example 1 | | Example 2 | | Example 3 | | Example 4 | | Example 5 | | Example 6 | |
|---|---|---|---|---|---|---|---|---|---|---|---|---|
| | % | m/g | % | m/g | % | m/g | % | m/g | % | m/g | % | m/g |
| Isobornyl acrylate (SR506A) | 20.0 | 200 | — | — | 27.0 | 160.4 | 31.5 | 25.2 | 26.0 | 20.8 | 32.0 | 8.0 |
| Isobornyl methacrylate (SR423A) | — | — | 27.0 | 134.9 | — | — | — | — | — | — | — | — |
| Triethylene glycol diacrylate (SR272) | 30.0 | 300 | 16.9 | 84.5 | 16.9 | 100.4 | 13.0 | 10.4 | 10.5 | 8.4 | 13.0 | 3.25 |
| Tetraethylene glycol diacrylate (SR268) | 10.0 | 100 | 9.7 | 48.4 | 9.7 | 57.6 | 4.0 | 3.2 | 3.5 | 2.8 | 4.0 | 1.0 |
| Tris (2-hydroxy ethyl) isocyanurate triacrylate (SR368) | — | — | 6.5 | 32.4 | 6.5 | 38.5 | 8.5 | 6.8 | 7.0 | 5.6 | — | — |
| 2-[[(butylamino)carbonyl]oxy]ethyl acrylate (Photomer 4184) | 10.0 | 100 | 9.7 | 48.4 | 9.7 | 57.6 | — | — | — | — | — | — |
| Urethane acrylate oligomer (BR-741) | 26.7 | 267 | 27.0 | 134.9 | 27.0 | 160.4 | — | — | — | — | — | — |
| Urethane acrylate oligomer (BR-741D) | — | — | — | — | — | — | 40.0 | 32.0 | — | — | — | — |
| Urethane acrylate oligomer (BR-952) | — | — | — | — | — | — | — | — | 50.0 | 40 | 38.0 | 9.5 |
| Urethane acrylate oligomer (BR-941) | — | — | — | — | — | — | — | — | — | — | 10.0 | 2.5 |
| Photoinitiator A (Irgacure-184) | 3.0 | 30.0 | 3.00 | 15.0 | 3.00 | 17.8 | 2.5 | 2.00 | 2.5 | 2.0 | 2.5 | 0.63 |
| Photoinitiator B (Irgacure TPO) | 0.3 | 3.0 | 0.30 | 1.5 | 0.30 | 1.8 | 0.5 | 0.40 | 0.5 | 0.4 | 0.5 | 0.13 |
| TOTAL | 100 | 1000 | 100 | 500 | 100 | 594.5 | 100 | 80.0 | 100 | 80.0 | 100 | 25.0 |

TABLE 1B

Relevant Ratios for Curable Ink Compositions.

| Example | Ratio (lowest viscosity monomer/highest viscosity monomer) | Ratio (total oligomer/total monomer) |
|---|---|---|
| Example 1 | 2.00 | 0.38 |
| Example 2 | 2.78 | 0.39 |
| Example 3 | 2.78 | 0.39 |
| Example 4 | 7.88 | 0.70 |
| Example 5 | 7.43 | 1.06 |
| Example 6 | 8.00 | 0.98 |

Rheology.

Examples 1-6 and Comparative Examples A, B were tested by measuring their complex viscosities over temperature using an Ares G2 rheometer equipped with a 25 mm Parallel plate and Peltier heating system. Samples of the curable ink compositions were loaded on the rheometer at 102° C., allowed to equilibrate, then swept over temperature to 25° C. at a rate of 1.5° C./min at 10 rad/s. Viscosity data for the temperature range 80° C. to 100° C. (the jetting regime) is shown in FIG. 1. The viscosity of each of the Examples (particularly for Examples 4-6 with high amounts of oligomer) is sufficiently low so as to ensure jettability within the jetting regime and at the jetting temperature.

Curing (Thick Mold Method).

A thick mold method was used to cure the curable ink compositions as follows. A 1 cm×6 cm×3 cm silicone rubber mold was filled with a curable ink composition and then subjected to LED curing for 14 seconds at 50% power, with a gap from lamp to substrate of 25.4 mm. The UV light was supplied by Phoseon RX Fireline 125-20 (emitting window dimensions [mm]) 395 nm (wavelength) 8 W/cm² (power). The cured part was removed from the mold and allowed to cool to room temperature between 2 stainless steel plates.

Curing (Jetting Method).

A jetting method was used to cure the curable ink compositions as follows. First, a curable ink composition was loaded into a reservoir (set at a temperature of 85° C.) of a home-built MJM system. Drop mass was set to between 22 and 24 ng to ensure consistent jetting conditions between ink compositions. The effective $V_{pp}$ (voltage peak-to-peak) values varied between 32 and 38 Volts (DC voltage) from ink composition to ink composition to ensure that the drop mass stayed in the aforementioned range. Layer heights normally fell in the 20-22 nm range. Final printed part dimensions averaged approximately 60 mm by 12.5 mm by 3 mm. Each layer was subjected to LED curing for 200 ms at 15% power, with a gap of lamp to substrate of 5 mm. The UV light was supplied by Phoseon FireJet FJ200 150-20 (emitting window dimensions [mm]) 395 nm (wavelength) and 8 W/cm² (power).

Characterization of Cured Ink Compositions.

Figure 2:
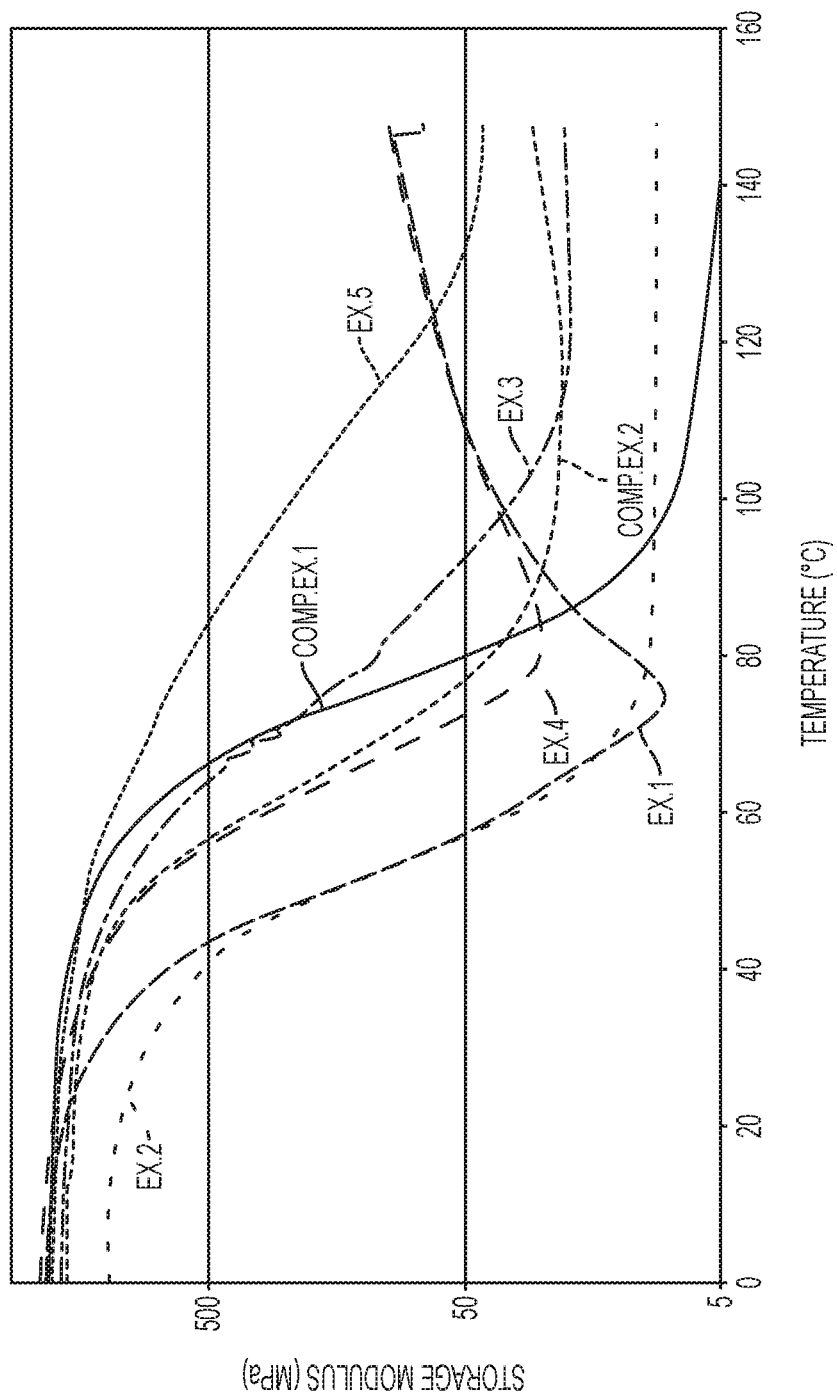
FIG. 2 shows storage modulus data versus temperature for illustrative curable ink compositions and two comparative curable ink compositions.
Figure 3:
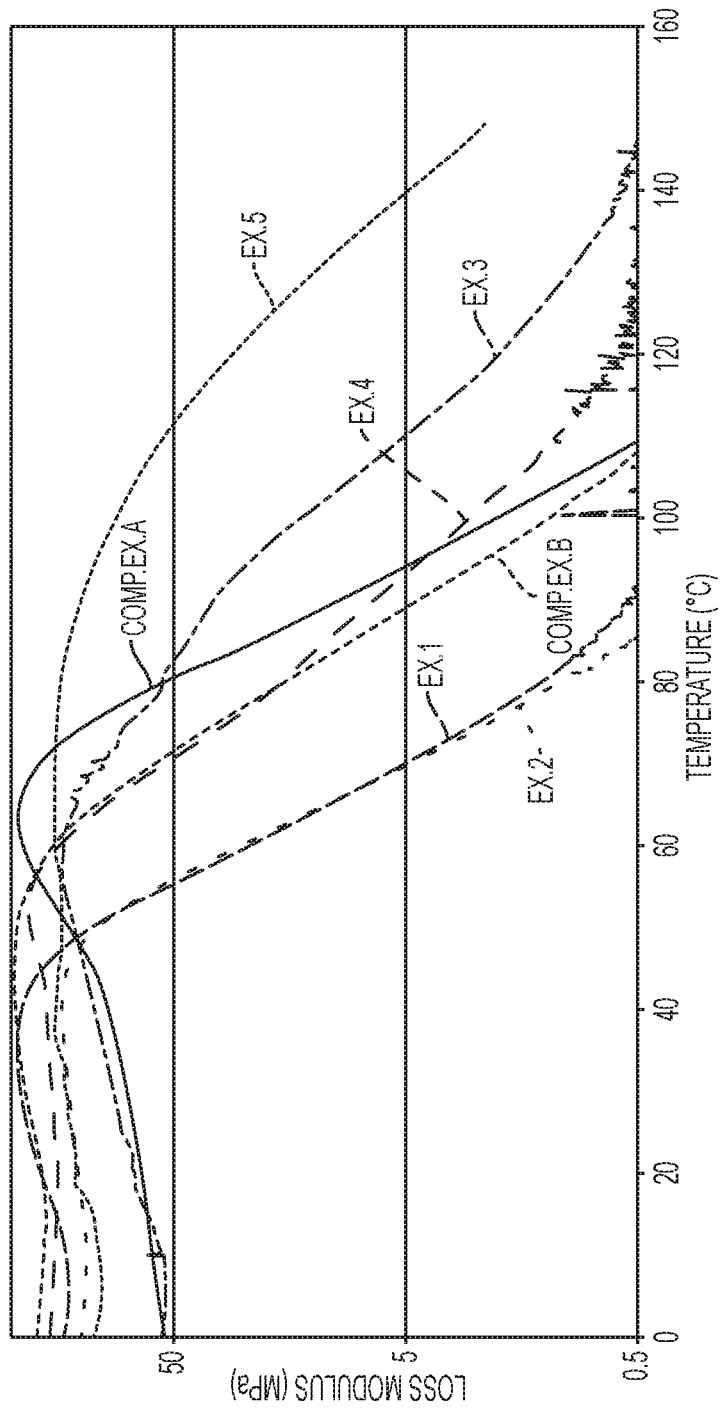
FIG. 3 shows loss modulus data versus temperature for illustrative curable ink compositions and two comparative curable ink compositions.
Figure 4:
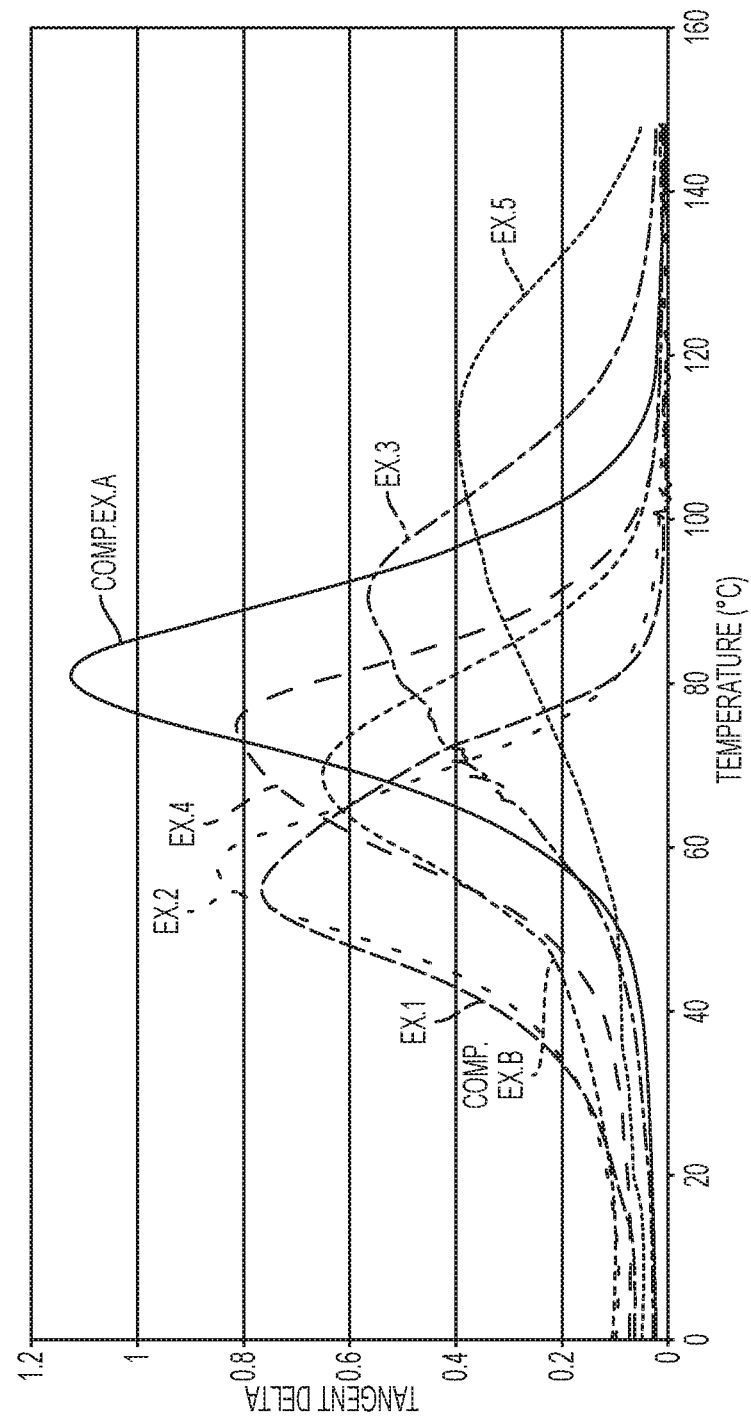
FIG. 4 shows tan δ data versus temperature for illustrative curable ink compositions and two comparative curable ink compositions.

Cured parts were prepared by using the jetting method described above and tested through a DMA (Dynamic Mechanical Analysis) Q800 apparatus, commercially available from TA Instruments. The DMA apparatus applies a sinusoidal stress to the cured part while measuring the resulting strain. The frequency of the applied stress was generally set to 1 KHz and the temperature was ramped from −50° C. to 150° C. at a constant rate (3° C./min or lower). From the stress/strain data, the complex modulus (E*) was calculated. The storage modulus (E'), the loss modulus (E") and the tangent of phase difference δ (tan δ) were extracted from the complex modulus as described above. The results are shown in FIG. 2 (storage modulus), FIG. 3 (loss modulus) and FIG. 4 (tan δ). Storage modulus is the elastic constituent of a material and can be related to material stiffness (the greater the value, the greater the stiffness). Loss modulus is a measure of the viscous nature of a material and can be related to the material's ability to dissipate energy via molecular motion (the greater the value, the more viscous nature). The tan δ is the ratio of loss modulus to storage modulus. The tan δ peak temperature (the temperature at which the tan δ curve is at its maximum) is an estimate of a material's glass transition temperature, $T_g$. The tan δ peak value itself is inversely proportional to the measure of a material's ability to absorb energy without deforming. In other words, the smaller the tan δ peak value, the more rugged the material.

Table 2 shows a summary of the mechanical properties of cured parts formed using curable ink compositions of Examples 1-5, an Example 7, and Comparative Examples A, B. Example 7 was prepared as described above for Examples 1-5. The formulation of Example 7 was as follows: 37% Isobornyl acrylate (SR506A), 15% Triethylene glycol diacrylate (SR272), 5.0% Tetraethylene glycol diacrylate (SR268), 10% Tris (2-hydroxy ethyl) isocyanurate triacrylate (SR368), 30% Urethane acrylate oligomer (BR-952), 2.0% Photoinitiator A (Irgacure-184), 1.0% Photoinitiator B (Irgacure TPO). For Example 7, the ratio of the lowest viscosity monomer (isobornyl (meth)acrylate) to the highest viscosity monomer (tetraethylene glycol diacrylate) is 7.40 and the ratio of total oligomer to total monomer is 0.45.

TABLE 2

Summary of Mechanical Properties.

| Sample | E' at 25° C. (MPa) | E' at 65° C. (MPa) | Tan δ peak temperature (° C.) | Tan δ peak value |
|---|---|---|---|---|
| Example 1 | 1505 | 16 | 53.8 | 0.759 |
| Example 2 | 1024 | 15 | 55.8 | 0.834 |
| Example 3 | 1835 | 479 | 92.1 | 0.663 |
| Example 4 | 1732 | 121 | 81.2 | 0.900 |
| Example 5 | 1956 | 852 | 110.6 | 0.433 |
| Example 7 | 1225 | 975.3 | 124.17 | 0.4676 |
| Comparative Example A | — | — | 63.1 | 1.122 |
| Comparative Example B | 1707 | 122 | 66.0 | 0.674 |

Table 2 shows that Examples 5 and 7 exhibited a marked increase in storage modulus at both room temperature (about 25° C.) and post-processing temperature (about 65° C.). The other curable ink compositions exhibit a greater drop in storage modulus between the two temperatures, indicative of part softening with increased temperature. This is predictive of how well the ink compositions will withstand stresses at these temperatures. 3D objects made with the ink compositions of Examples 5 and 7 will be able to withstand mechanical stresses better than the other ink compositions. In addition, Examples 5 and 7 exhibit the highest tan δ peak temperatures and the lowest tan δ peak values. Both are indicative of a more robust cured material.

It will be appreciated that variants of the above-disclosed and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A three-dimensional (3D) object curable ink composition for forming a 3D object via a digital additive manufacturing system, the composition comprising:
   greater than about 30 weight % of one or more oligomers,
   at least two monomers comprising a lowest viscosity monomer and a highest viscosity monomer, wherein the lowest viscosity monomer and the highest viscosity monomer are liquids at room temperature and are each characterized by a dynamic viscosity value at about 25° C.,
   one or more photoinitiators, and
   optionally, one or more additives,
   wherein the ratio of the weight % of the total amount of oligomers to the weight % of the total amount of monomers is at least about 0.5,
   wherein the ratio of the weight % of the lowest viscosity monomer to the weight % of the highest viscosity monomer is at least about 5,
   wherein all the oligomers in the composition are selected from a group consisting of oligomers having a dynamic viscosity in the range of about 1,000 cP to about 20,000 cP at about 25° C.,
   and further wherein the lowest viscosity monomer and the highest viscosity monomer are liquids at room temperature and each have a dynamic viscosity of less than about 50 cP at about 25° C.

2. The composition of claim 1 comprising at least about 50 weight % of the one or more oligomers.

3. The composition of claim 1 comprising greater than 50 weight % to about 75 weight % of the one or more oligomers.

4. The composition of claim 1, wherein the ratio of the weight % of the total amount of oligomers to the weight % of the total amount of monomers is at least about 0.8.

5. A three-dimensional (3D) object curable ink composition for forming a 3D object via a digital additive manufacturing system, the composition comprising:
   greater than about 30 weight % of one or more oligomers,
   at least two monomers comprising a lowest viscosity monomer and a highest viscosity monomer, wherein the lowest viscosity monomer and the highest viscosity monomer are liquids at room temperature and are each characterized by a dynamic viscosity value at about 25° C.,
   one or more photoinitiators, and
   optionally, one or more additives,
   wherein the ratio of the weight % of the total amount of oligomers to the weight % of the total amount of monomers is at least about 0.5,
   wherein the ratio of the weight % of the lowest viscosity monomer to the weight % of the highest viscosity monomer is at least about 5,
   wherein all the oligomers in the composition are selected from a group consisting of oligomers having a dynamic viscosity in the range of about 1,000 cP to about 20,000 cP at about 25° C.,
   and further wherein the ratio of the weight % of the lowest viscosity monomer to the weight % of the highest viscosity monomer is greater than 7.

6. The composition of claim 1, wherein the one or more oligomers are urethane meth(acrylate) oligomers.

7. The composition of claim 1, wherein all the monomers in the composition are selected from monofunctional (meth)acrylates, multifunctional (meth)acrylates, monofunctional urethane (meth)acrylates and combinations thereof.

8. The composition of claim 1, wherein the composition does not comprise monofunctional urethane (meth)acrylate monomers.

9. The composition of claim 1, wherein the composition does not comprise a non-oligomeric urethane (meth)acrylate, a urea (meth)acrylate, or an isocyanurate (meth)acrylate.

10. The composition of claim 1, wherein the composition when cured exhibits one or more of the following characteristics: a storage modulus at 25° C. of from about 1000 MPa to about 2500 MPa; a storage modulus at 65° C. of from about 100 MPa to about 1000 MPa; a tan δ peak temperature of at least about 70° C.; and a tan δ peak value of less than about 0.6.

11. The composition of claim 10, wherein the composition when cured exhibits each of the characteristics.

12. The composition of claim 10, wherein the composition when cured exhibits a storage modulus at 25° C. of from about 1000 MPa to about 2000 MPa; a storage modulus at 65° C. of from about 800 MPa to about 900 MPa; a tan δ peak temperature of at least about 100° C.; and a tan δ peak value of less than about 0.5.

13. A three-dimensional object formed from the composition of claim 1.

14. A three-dimensional (3D) object curable ink composition for forming a 3D object via a digital additive manufacturing system, the composition comprising:
greater than about 30 weight % of one or more urethane (meth)acrylate oligomers,
a lowest viscosity monomer, a highest viscosity monomer, and optionally, one or more additional monomers, the lowest viscosity monomer, the highest viscosity monomer and the one or more additional monomers selected from monofunctional (meth)acrylates, multifunctional (meth)acrylates, monofunctional urethane (meth)acrylates and combinations thereof, wherein the lowest viscosity monomer and the highest viscosity monomer are liquids at room temperature and are each characterized by a dynamic viscosity value at about 25° C.,
one or more photoinitiators, and
optionally, one or more additives,
wherein the ratio of the weight % of the total amount of oligomers to the weight % of the total amount of monomers is at least about 0.5,
wherein the ratio of the weight % of the lowest viscosity monomer to the weight % of the highest viscosity monomer is at least about 5,
wherein all the oligomers in the composition are selected from a group consisting of oligomers having a dynamic viscosity in the range of about 1,000 cP to about 20,000 cP at about 25° C.,
and further wherein the lowest viscosity monomer and the highest viscosity monomer are liquids at room temperature and each have a dynamic viscosity of less than about 50 cP at about 25° C.

15. The composition of claim 14 comprising at least about 50 weight % of the one or more urethane (meth)acrylate oligomers.

16. The composition of claim 15, wherein the ratio of the weight % of the lowest viscosity monomer to the weight % of the highest viscosity monomer is greater than 7.

17. The composition of claim 14, wherein the composition does not comprise a non-oligomeric urethane (meth)acrylate, a urea (meth)acrylate, or an isocyanurate (meth)acrylate.

18. A method of forming a build structure comprising a 3D object and a support matrix, the method comprising:
selectively dispensing a 3D object curable ink composition towards a substrate via a digital additive manufacturing system, the curable ink composition comprising greater than about 30 weight % of one or more oligomers,
at least two monomers comprising a lowest viscosity monomer and a highest viscosity monomer, wherein the lowest viscosity monomer and the highest viscosity monomer are liquids at room temperature and are each characterized by a dynamic viscosity value at about 25° C.,
one or more photoinitiators, and
optionally, one or more additives,
wherein the ratio of the weight % of the total amount of oligomers to the weight % of the total amount of monomers is at least about 0.5,
wherein the ratio of the weight % of the lowest viscosity monomer to the weight % of the highest viscosity monomer is at least about 5,
wherein all the oligomers in the composition are selected from a group consisting of oligomers having a dynamic viscosity in the range of about 1,000 cP to about 20,000 cP at about 25° C.,
and further wherein the lowest viscosity monomer and the highest viscosity monomer are liquids at room temperature and each have a dynamic viscosity of less than about 50 cP at about 25° C.;
selectively dispensing a support material towards the substrate via the digital additive manufacturing system to form a support matrix for the 3D object, the 3D object and the support matrix providing a build structure corresponding to image data accessible by a processor of the digital additive manufacturing system; and
curing the as-deposited curable ink composition.

19. The composition of claim 1, wherein the composition consists of oligomers, including the one or more oligomers, selected from the group consisting of oligomers having a dynamic viscosity in the range of about 1,000 cP to about 20,000 cP at about 25° C.;
monomers, including the lowest viscosity monomer and the highest viscosity monomer, wherein all the monomers in the compositions are selected from monofunctional (meth)acrylates, multifunctional (meth)acrylates and combinations thereof;
photoinitiators, including the one or more photoinitiators; and
optionally, additives, including the one or more additives, wherein all the additives in the composition are selected from sensitizing agents, polymerization inhibitors and antioxidant agents.

* * * * *